(12) United States Patent
Lin et al.

(10) Patent No.: US 9,349,653 B2
(45) Date of Patent: May 24, 2016

(54) MANUFACTURING METHOD OF SEMICONDUCTOR STRUCTURE FOR PREVENTING SURFACE OF FIN STRUCTURE FROM DAMAGE AND PROVIDING IMPROVED PROCESS WINDOW

(71) Applicant: UNITED MICROELECTRONICS CORP., Hsinchu (TW)

(72) Inventors: Chao-Hung Lin, Changhua County (TW); Shih-Hung Tsai, Tainan (TW); Ssu-I Fu, Kaohsiung (TW); Chih-Sen Huang, Tainan (TW); Li-Wei Feng, Kaohsiung (TW); Jyh-Shyang Jenq, Tainan (JP)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/539,225

(22) Filed: Nov. 12, 2014

(65) Prior Publication Data

US 2016/0104647 A1 Apr. 14, 2016

(30) Foreign Application Priority Data

Oct. 8, 2014 (CN) .......................... 2014 1 0525197

(51) Int. Cl.
*H01L 21/8228* (2006.01)
*H01L 21/8222* (2006.01)
*H01L 21/8234* (2006.01)
*H01L 21/768* (2006.01)

(52) U.S. Cl.
CPC .. *H01L 21/823475* (2013.01); *H01L 21/76847* (2013.01); *H01L 21/823431* (2013.01)

(58) Field of Classification Search
USPC ................................. 438/422–430, 365, 655
See application file for complete search history.

(56) References Cited

U.S. PATENT DOCUMENTS

| 5,789,320 | A | * | 8/1998 | Andricacos | H01L 28/60 257/E21.011 |
|---|---|---|---|---|---|
| 7,524,742 | B2 | * | 4/2009 | Chou | H01L 21/76802 257/E21.058 |
| 2012/0299098 | A1 | * | 11/2012 | Liu | H01L 29/42328 257/347 |
| 2014/0349476 | A1 | * | 11/2014 | Chen | H01L 21/76816 438/620 |

OTHER PUBLICATIONS

Chieh-Te Chen et al, "Manufacturing Method for Forming a Semiconductor Structure", U.S. Appl. No. 13/902,977, filed May 27, 2013.

* cited by examiner

*Primary Examiner* — Marc Armand
*Assistant Examiner* — Wilner Jean Baptiste
(74) *Attorney, Agent, or Firm* — WPAT, P.C.; Justin King (57) ABSTRACT

A manufacturing method of a semiconductor structure is provided. The manufacturing method includes the following steps. A substrate is provided. A fin structure and an inter-layer dielectric layer are formed on the substrate. A plurality of gate structures is formed on the substrate. A cap layer is formed on the gate structures. A hard mask is formed on the cap layer. A first patterned photoresist layer covering the gate structures is formed on the hard mask. The hard mask is etched and patterned to form a patterned hard mask, such that the patterned hard mask covers the gate structures. A second patterned photoresist layer including a plurality of openings corresponding to the fin structure is formed on the patterned hard mask. The cap layer and the inter-layer dielectric layer are etched to form a plurality of first trenches exposing part of the fin structure.

20 Claims, 8 Drawing Sheets

MANUFACTURING METHOD OF SEMICONDUCTOR STRUCTURE FOR PREVENTING SURFACE OF FIN STRUCTURE FROM DAMAGE AND PROVIDING IMPROVED PROCESS WINDOW

This application claims the benefit of People's Republic of China application Serial No. 201410525197.0, filed Oct. 8, 2014, the disclosure of which is incorporated by reference herein in its entirety.

BACKGROUND

1. Technical Field

The disclosure relates in general to a manufacturing method of a semiconductor structure, and more particularly to a manufacturing method of a semiconductor structure for preventing the surface of the fin structure from damage and providing an improved process window.

2. Description of the Related Art

With a trend toward scaling down the size of the semiconductor device, the line width of interconnections has continuously shrunk. In general, discrete devices in integrated circuits are connected to each other through contact plugs (or contact slots) and interconnection structures, and their related manufacturing methods have become an important matter in the next-generation semiconductor devices.

In current fabricating processes, due to the limitations of the back end of the line (BEOL) process capacity, the yield of contact plugs with high aspect ratio (HAR) is relatively low and cannot reach the new requirements. Accordingly, in order to overcome the drawback, there is a need to provide a modified method for fabricating interconnection structures with better yields.

SUMMARY

The disclosure is directed to a manufacturing method of a semiconductor structure for preventing the surface of the fin structure from damage and providing an improved process window by simple processes.

In one aspect of the present invention, a manufacturing method of a semiconductor structure is provided. The manufacturing method includes the following steps. A substrate is provided. A fin structure and an inter-layer dielectric layer are formed on the substrate. A plurality of gate structures is formed on the substrate. A cap layer is formed on the gate structures. A hard mask is formed on the cap layer. A first patterned photoresist layer covering the gate structures is formed on the hard mask. The hard mask is etched and patterned to form a patterned hard mask, such that the patterned hard mask covers the gate structures. A second patterned photoresist layer including a plurality of openings corresponding to the fin structure is formed on the patterned hard mask. The cap layer and the inter-layer dielectric layer are etched to form a plurality of first trenches exposing part of the fin structure.

In another aspect of the present invention, a manufacturing method of a semiconductor structure is provided. The manufacturing method includes the following steps. A substrate is provided. A fin structure and an inter-layer dielectric layer are formed on the substrate. A plurality of gate structures is formed on the substrate. A cap layer is formed on the gate structures. A hard mask is formed on the cap layer. A third patterned photoresist layer including a plurality of openings corresponding to the fin structure is formed on the hard mask. The hard mask is etched to form a patterned hard mask. A fourth patterned photoresist layer covering the gate structures is formed on the patterned hard mask. The cap layer and the inter-layer dielectric layer are etched to form a plurality of second trenches exposing part of the fin structure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are to be regarded as an illustrative sense rather than a restrictive sense.

FIG. 1-8 show a process for manufacturing a semiconductor structure according to an embodiment of the disclosure. The manufacturing method of the semiconductor structure may include the following steps.

Figure 1:
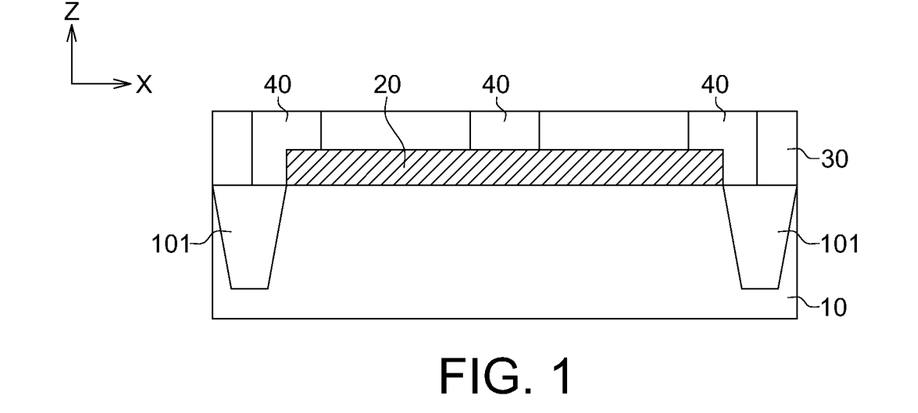
FIG. 1-8 show a process for manufacturing a semiconductor structure according to an embodiment of the disclosure.

As shown in FIG. 1, a substrate 10 is provided. The substrate 10 is such as a silicon substrate, and a fin structure 20 and an inter-layer dielectric layer 30 are formed on the substrate 10. The fin structure 20 may be formed by etching the substrate 10 or by epitaxial growth process. Then, a plurality of gate structures 40 is formed on the substrate 10. In this embodiment, a plurality of shallow trench isolations (STI) 101 may be formed in the substrate 10, and the fin stricture 20 may be adjacent to the shallow trench isolations 101.

It should be noted that the positions of the fin structure 20 and the gate structures 40 are not limited to the positions as shown in FIG. 1. The positions of the fin structure 20 and the gate structures 40 may be changed with the practical applications.

Figure 2A:
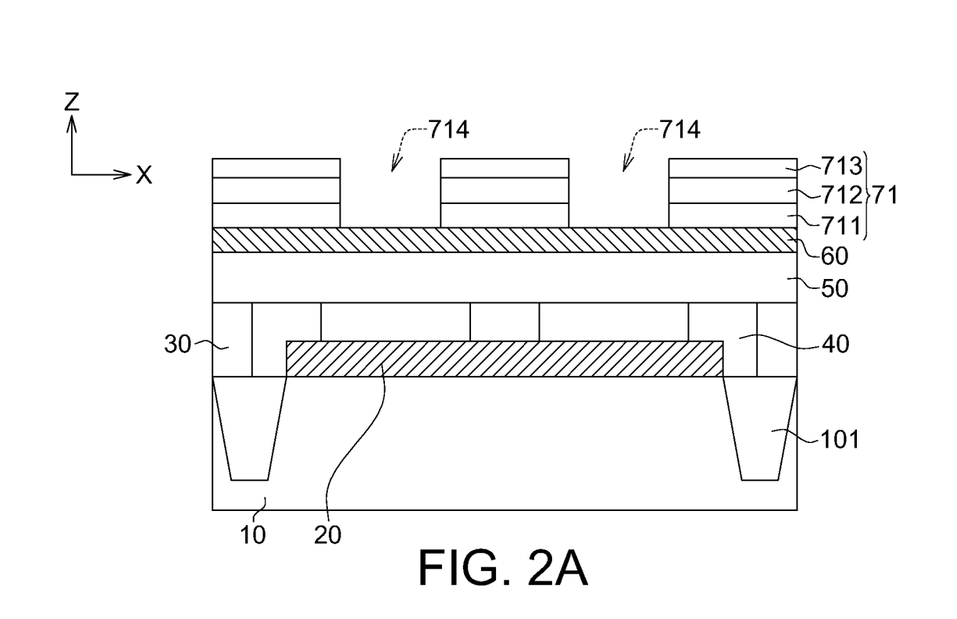

As shown in FIG. 2A, a cap layer 50 is formed on the gate structures 40, and then a hard mask 60 is formed on the cap layer 50.

In one embodiment, the cap layer 50 may be such as a dielectric layer. The dielectric layer may include oxides or a material with a low dielectric constant (a low-κ dielectric). A material of the hard mask 60 may include titanium nitride (TiN), and a thickness of the hard mask 60 may be between 200 and 500 Å.

Besides, the gate structures 40 in one embodiment according to the disclosure may be such as polysilicon or metal gate structures.

Then, a first patterned photoresist layer 71 is formed on the hard mask 60. As shown in FIG. 2A, the first patterned photoresist layer 71 may include a plurality of openings 714 and the first patterned photoresist layer 71 covers the gate structures. For example, three gate structures 40 are formed in the embodiment of the disclosure, and the first patterned photoresist layer 71 covers the positions on the hard mask 60 corresponding to the three gate structures 40.

Figure 2B:
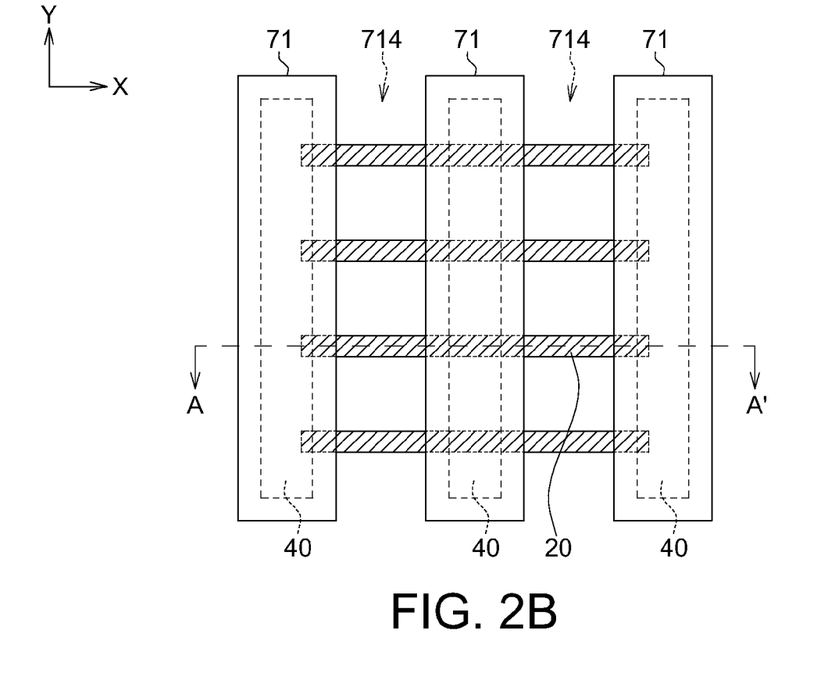

FIG. 2B illustrates the structure in FIG. 2A from another aspect. For example, FIG. 2B is a top-view of the semiconductor structure in one embodiment according to the disclosure, and FIG. 2A illustrates a cross-sectional view of the semiconductor structure along A-A' line in FIG. 2B. It should be noted that some elements, for example, the cap layer 50 and the hard mask 60 are omitted in FIG. 2B for showing the relationship between the first patterned photoresist layer 71 and the fin structure 20 (or the gate structures 40) more clearly.

FIG. 2B clearly illustrates that the first patterned photoresist layer 71 covers and shields on the three gate structures 40, and the opening 714 exposes the area on part of the fin structure 20.

Figure 3:
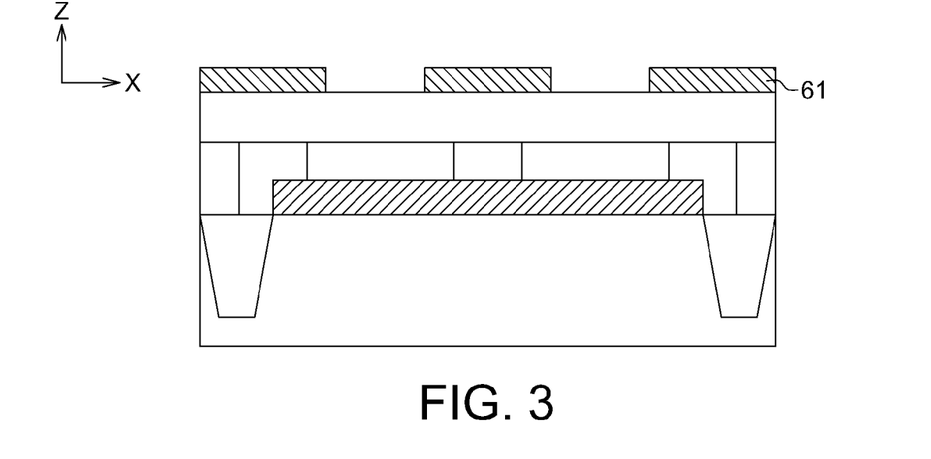

As shown in FIG. 3, the hard mask 60 is etched and patterned to form the patterned hard mask 61. The patterned hard mask 61 covers the gate structures 40. That is, the patterned hard mask 61 may cover the upper positions of the three gate structures 40.

Figure 4A:
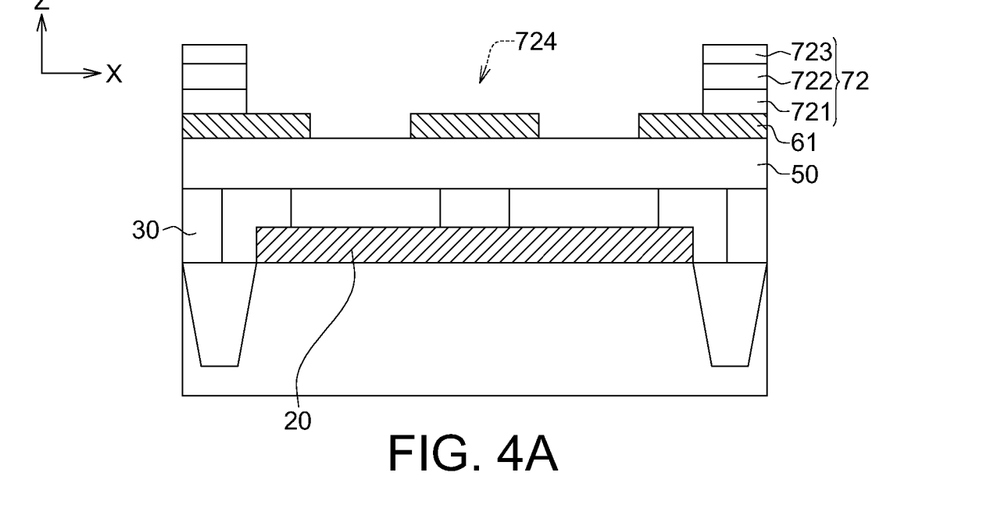

As shown in FIG. 4A, a second patterned photoresist layer 72 is formed on the patterned hard mask. In this embodiment, the second patterned photoresist layer 72 may include at least one opening 724 corresponding to the fin structure 20.

Figure 4B:
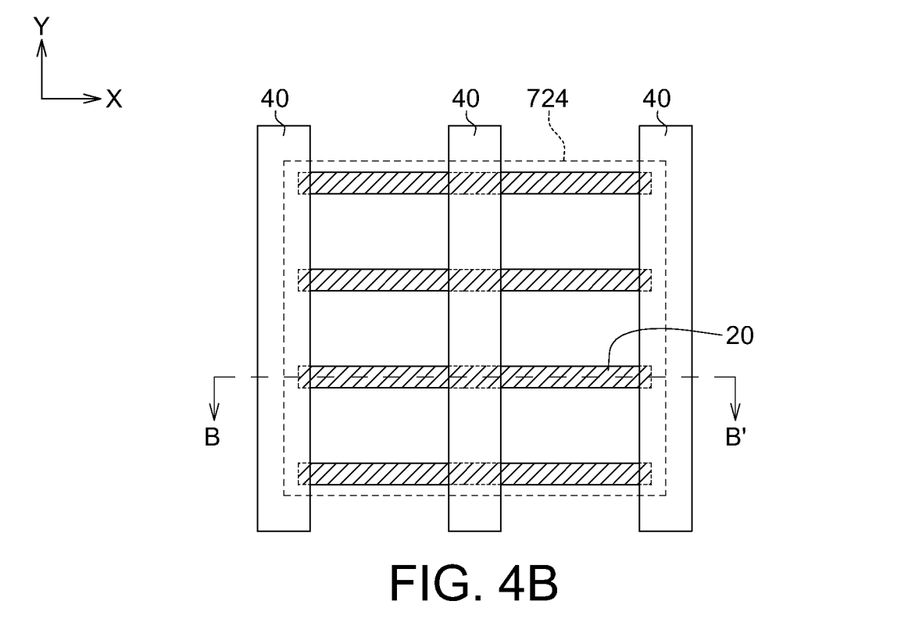

Similarly, FIG. 4B illustrates the structure in FIG. 4A from another aspect. For example, FIG. 4B is a top-view of the semiconductor structure in one embodiment according to the disclosure, and FIG. 4A illustrates a cross-sectional view of the semiconductor structure along B-B' line in FIG. 4B. It should be noted that some elements, for example, the cap layer 50 and the patterned hard mask 61 are omitted in FIG. 4B for showing the relationship between the opening 724 of the second patterned photoresist layer 72 and the fin structure 20 more clearly.

FIG. 4B clearly illustrates that the opening 724 of the second patterned photoresist layer 72 corresponds to the fin structure 20 and exposes the upper area of the fin structure 20.

Besides, the first patterned photoresist layer 71 and the second patterned photoresist layer 72 may be tri-layer structures. For example, the first patterned photoresist layer 71 may include an organic dielectric layer (ODL) 711, a silicon-containing hard mask bottom anti-reflecting coating (SHB) layer 712 and a photoresist layer (PR) 713. Similarly, the second patterned photoresist layer 72 may include an organic dielectric layer 721, a silicon-containing hard mask bottom anti-reflecting coating layer 722 and a photoresist layer 723. But the disclosure is not limited thereto.

Figure 5:
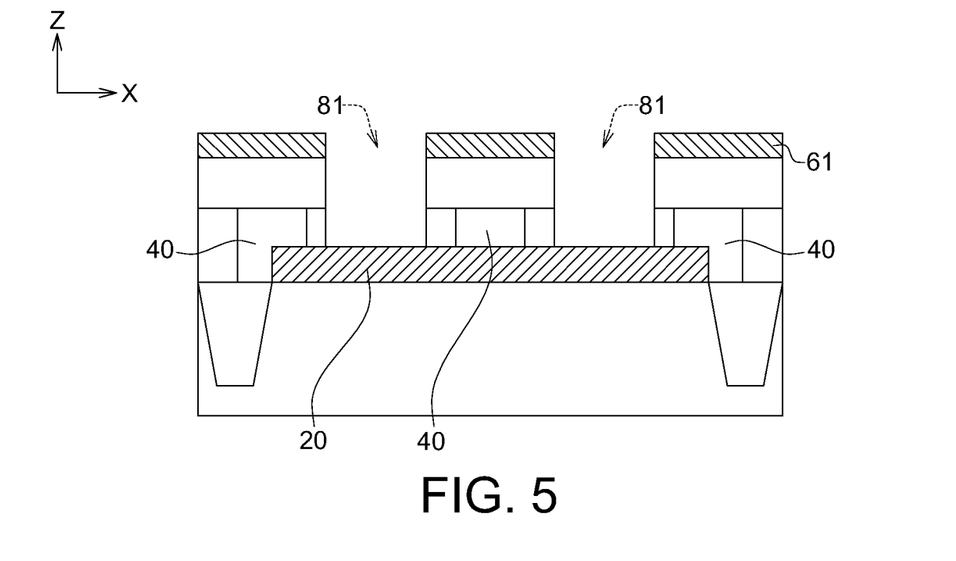

As shown in FIG. 5, the cap layer 50 and the inter-layer dielectric layer 30 are etched to form a plurality of first trenches 81. The first trenches 81 may expose part of the fin structure 81. Then, the first trenches 81 may be cleaned.

In this embodiment, the patterned hared mask 61 has not been removed during the process step in FIG. 5. Therefore, the elements under the patterned hard mask 61, such as the gate structures 40 may be protected by the patterned hard mask 61 in the subsequent steps.

Figure 6:
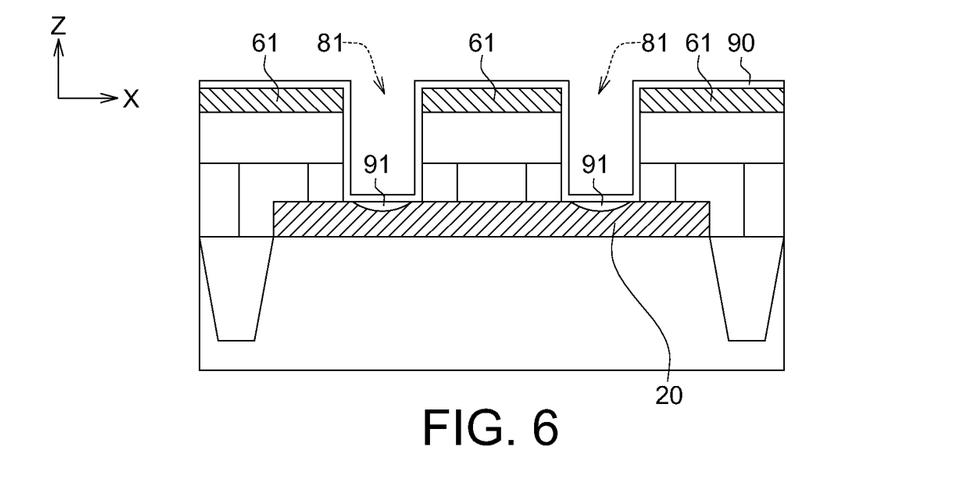

As shown in FIG. 6, a barrier layer 90 is formed on surfaces of the patterned hard mask 61 and the first trenches 81. In this embodiment, the barrier layer 90 directly contacts the patterned hard mask 61, and the barrier layer 90 may such as include titanium and titanium nitride (Ti/TiN). In one embodiment, the semiconductor structure is heated, such that a metal silicide 91, for example, a titanium silicide (TiSi) may be formed on the contact surface of the barrier layer 90 and the fin structure 20 to reduce the resistance of a contact plug 93 subsequently formed in the following step.

Figure 7:
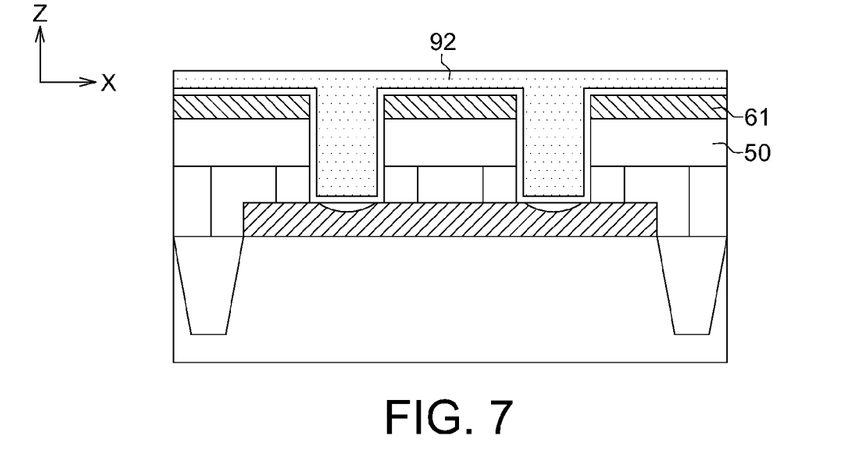
Figure 8:
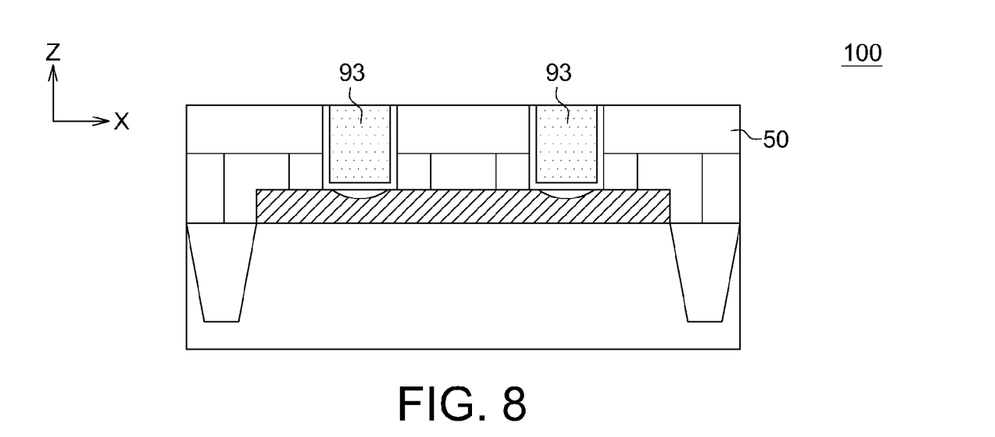

As shown in FIG. 7, a conductive structure 92 is formed in the first trenches 81 and on the surface of the patterned hard mask 61. Then, a planarization process is executed as shown in FIG. 8. The bather layer 90, the patterned hard mask 61 and the conductive structure 92 on a surface of the cap layer 50 are removed simultaneously, such that the surface of the cap layer 50 is exposed, and a contact plug 93 is formed in the first trenches 81 to form the semiconductor structure 100 in the embodiment according to the disclosure.

FIG. 9-14 show a process for manufacturing a semiconductor structure according to another embodiment of the disclosure. In this embodiment, the process step in FIG. 9 may such as follows the process step in FIG. 1. Similarly, the substrate 10 may include a plurality of shallow trench isolations 101, and a fin structure 20, an inter-layer dielectric layer 30 and a plurality of gate structures 40 may be formed on the substrate 10. Then, a cap layer 50 and a hard mask 60 may be formed on the gate structures 40 sequentially.

Figure 9:
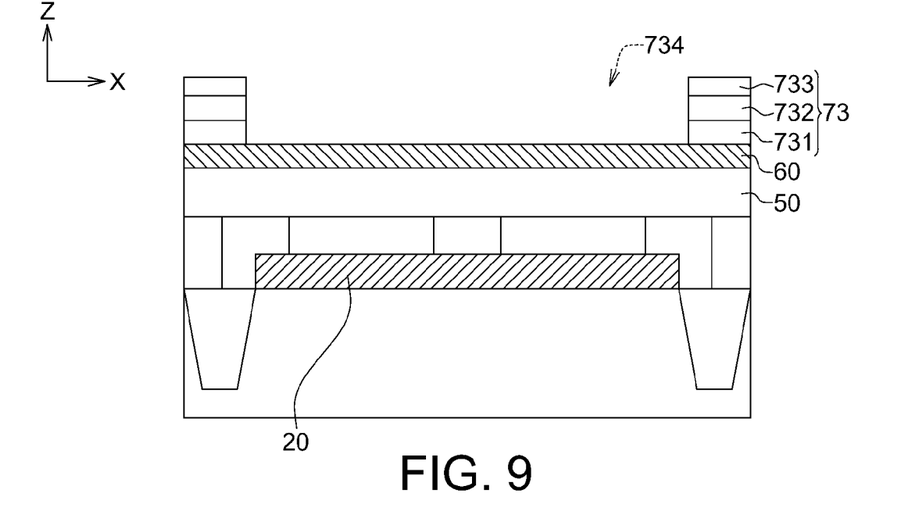
FIG. 9-14 show a process for manufacturing a semiconductor structure according to another embodiment of the disclosure.

As shown in FIG. 9, a third patterned photoresist layer 73 is formed on the hard mask 60. The third patterned photoresist layer 73 includes at least one opening 734 corresponding to the fin structure 20.

Figure 10:
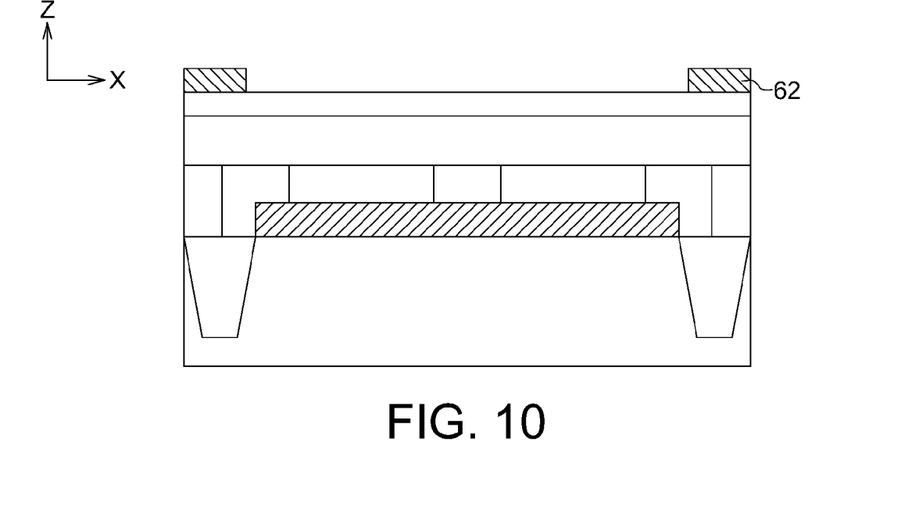

Then, the hard mask 60 is etched and patterned to form the patterned hard mask 62 as shown in FIG. 10.

Figure 11:
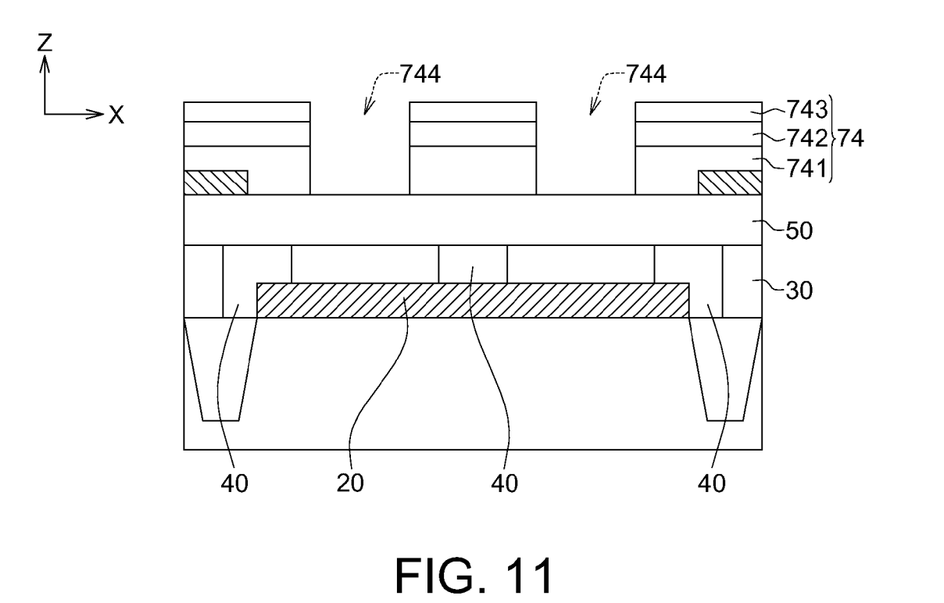

As shown in FIG. 11, a fourth patterned photoresist layer 74 is formed on the patterned hard mask 62. The fourth patterned photoresist layer 74 covers the gate structures 40. In this embodiment, the fourth patterned photoresist layer 74 may include a plurality of openings 744. For example, three gate structures 40 are formed in the embodiment. The fourth patterned photoresist layer 74 covers the cap layer 50 corresponding to the positions of the three gate structures 40. The openings 744 may correspond to part of the fin structure 20.

It should be noted that after the process step in FIG. 10, the patterned hard mask 62 may be removed, and then the process step in FIG. 11 will be executed in some embodiment. That is, it may be selective to remove the patterned hard mask 62.

Figure 12:
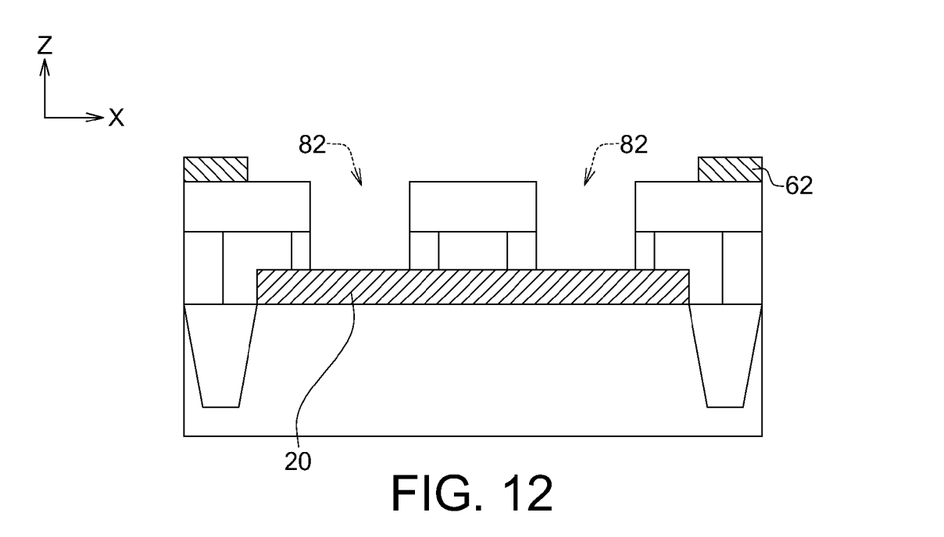

As shown in FIG. 12, the cap layer 50 and the inter-layer dielectric layer 30 are etched to form a plurality of second trenches 82. In this embodiment, the second trenches 82 may expose part of the fin structure 20. Then, the second trenches 82 may be cleaned to remove oxides on the surface of the fin structure 20 and reduce the resistance of a contact plug 93 subsequently formed in the following step.

Figure 13:
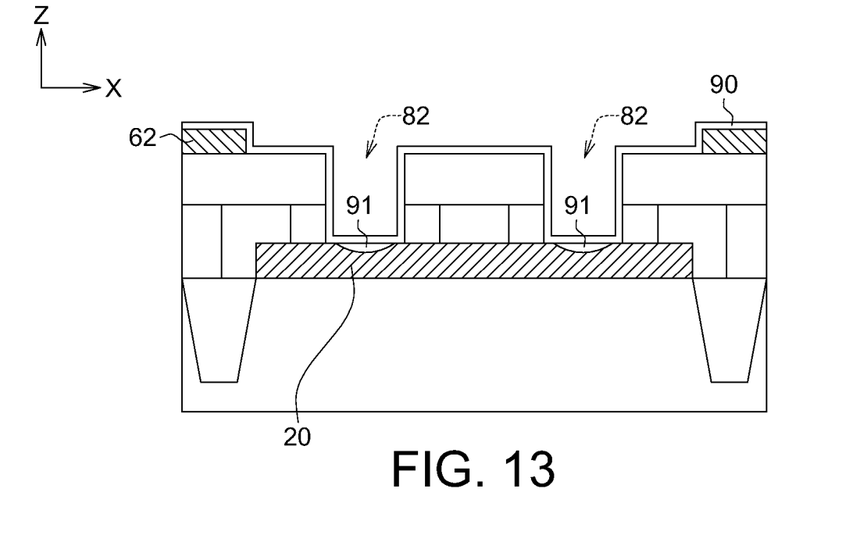
Figure 14:
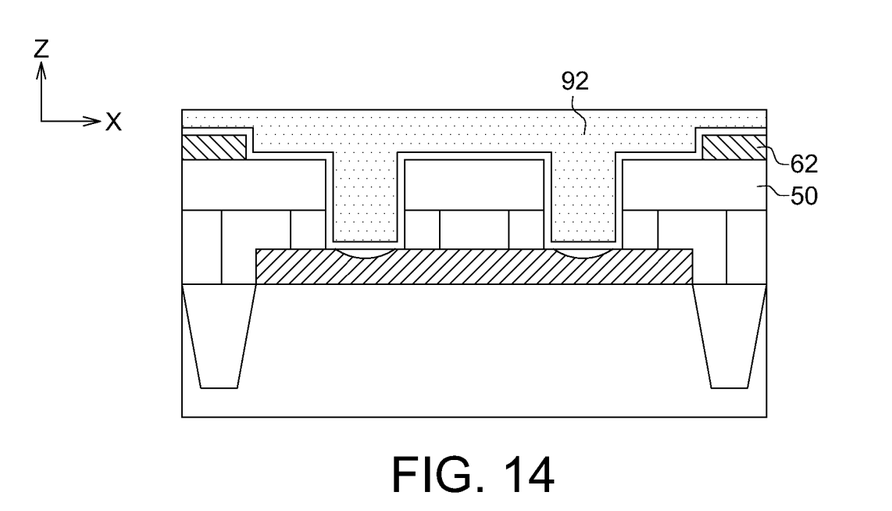

The process steps in FIG. 13 and FIG. 14 are similar to the process steps in FIG. 6 and FIG. 7. As shown in FIG. 13, a barrier layer 90 may be formed on surfaces of the patterned hard mask 62, the second trenches 82 and the cap layer 50. In this embodiment, the barrier layer 90 may such as include titanium and titanium nitride. In one embodiment, the semiconductor structure is heated, such that a metal silicide 91, for example, a titanium silicide (TiSi) may be formed on the contact surface of the barrier layer 90 and the fin structure 20.

As shown in FIG. 14, a conductive structure 92 is formed in the second trenches 82 and on the surfaces of cap layer 50 and the patterned hard mask 62. Then, the barrier layer 90, the patterned hard mask 62 and the conductive structure 92 on the surface of the cap layer 50 are removed simultaneously, such that the surface of the cap layer 50 is exposed, and a contact plug 93 is formed in the second trenches 82 to form the semiconductor structure 100 as shown in FIG. 8.

Similarly, the third patterned photoresist layer 73 and the fourth patterned photoresist layer 74 may be tri-layer structures. For example, the third patterned photoresist layer 73 may include an organic dielectric layer 731, a silicon-containing hard mask bottom anti-reflecting coating layer 732 and a photoresist layer 733. The fourth patterned photoresist layer 74 may include an organic dielectric layer 741, a silicon-containing hard mask bottom anti-reflecting coating layer 742 and a photoresist layer 743. But the disclosure is not limited thereto.

According to the embodiments above, the elements (or structures) under the hard mask 60 may be protected by the hard mask 60 to enhance the yield of contact plugs with high aspect ratio and the interconnection, and to prevent the surface of the fin structure from damage and provide an improved process window in the manufacturing method of the disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A manufacturing method of a semiconductor structure, comprising:
    providing a substrate;
    forming a fin structure and an inter-layer dielectric layer on the substrate;
    forming a plurality of gate structures on the substrate;
    forming a cap layer on the gate structures;
    forming a hard mask on the cap layer;
    forming a first patterned photoresist layer on the hard mask, wherein the first patterned photoresist layer covers the gate structures;
    etching and patterning the hard mask to form a patterned hard mask, such that the patterned hard mask covers the gate structures;
    forming a second patterned photoresist layer on the patterned hard mask, wherein the second patterned photoresist layer comprises a plurality of openings corresponding to the fin structure; and
    etching the cap layer and the inter-layer dielectric layer to form a plurality of first trenches, wherein the first trenches expose part of the fin structure.

2. The manufacturing method according to claim 1, further comprising:
    forming a barrier layer on surfaces of the patterned hard mask and the first trenches, wherein the barrier layer directly contacts the patterned hard mask;
    forming a conductive structure in the first trenches and on the surface of the patterned hard mask; and
    removing the barrier layer, the patterned hard mask and the conductive structure on a surface of the cap layer simultaneously, such that the surface of the cap layer is exposed.

3. The manufacturing method according to claim 2, further comprising:
    heating the semiconductor structure, such that a metal silicide is formed on a contact surface of the barrier layer and the fin structure.

4. The manufacturing method according to claim 1, further comprising:
    forming a plurality of shallow trench isolations in the substrate.

5. The manufacturing method according to claim 1, further comprising:
    cleaning the first trenches.

6. The manufacturing method according to claim 1, wherein a material of the hard mask comprises titanium nitride.

7. The manufacturing method according to claim 1, wherein a thickness of the hard mask is between 200 and 500 Å.

8. The manufacturing method according to claim 1, wherein the gate structures comprise metal gate structures.

9. The manufacturing method according to claim 1, wherein the cap layer is a dielectric layer comprising oxides or a material with a low dielectric constant.

10. The manufacturing method according to claim 1, wherein the first patterned photoresist layer and the second patterned photoresist layer are tri-layer structures comprising an organic dielectric layer, a silicon-containing hard mask bottom anti-reflecting coating layer and a photoresist layer.

11. A manufacturing method of a semiconductor structure, comprising:
    providing a substrate;
    forming a fin structure and an inter-layer dielectric layer on the substrate;
    forming a plurality of gate structures on the substrate;
    forming a cap layer on the gate structures;
    forming a hard mask on the cap layer;
    forming a first patterned photoresist layer on the hard mask, wherein the first patterned photoresist layer comprises a plurality of openings corresponding to the fin structure;
    etching and patterning the hard mask to form a patterned hard mask;
    forming a second patterned photoresist layer on the patterned hard mask, wherein the second patterned photoresist layer covers the gate structures; and
    etching the cap layer and the inter-layer dielectric layer to form a plurality of second trenches, wherein the second trenches expose part of the fin structure.

12. The manufacturing method according to claim 11, further comprising:
    removing the patterned hard mask.

13. The manufacturing method according to claim 11, further comprising:
    forming a barrier layer on surfaces of the cap layer, the patterned hard mask and the second trenches;
    forming a conductive structure in the second trenches and on the surfaces of the cap layer and the patterned hard mask; and
    removing the barrier layer, the patterned hard mask and the conductive structure on the surface of the cap layer simultaneously, such that the surface of the cap layer is exposed.

14. The manufacturing method according to claim 13, further comprising:
    heating the semiconductor structure, such that a metal silicide is formed on a contact surface of the barrier layer and the fin structure.

15. The manufacturing method according to claim 11, further comprising:
    forming a plurality of shallow trench isolations in the substrate.

16. The manufacturing method according to claim 11, further comprising:
    cleaning the second trenches.

17. The manufacturing method according to claim 11, wherein a material of the hard mask comprises titanium nitride, and a thickness of the hard mask is between 200 and 500 Å.

18. The manufacturing method according to claim 11, wherein the gate structures comprise metal gate structures.

19. The manufacturing method according to claim 11, wherein the cap layer is a dielectric layer comprising oxides or a material with a low dielectric constant.

20. The manufacturing method according to claim 11, wherein the first patterned photoresist layer and the second patterned photoresist layer are tri-layer structures comprising an organic dielectric layer, a silicon-containing hard mask bottom anti-reflecting coating layer and a photoresist layer.

* * * * *